(12) United States Patent
Hobbie (10) Patent No.: US 11,233,405 B1
(45) Date of Patent: Jan. 25, 2022

(54) CLOSED CLEAN ENERGY GENERATION AND REUSE SYSTEM FOR USE IN MISSION CRITICAL FACILITIES

(71) Applicant: Silent Partner Group of Companies, Inc., Tampa, FL (US)

(72) Inventor: Dale Hobbie, Brandon, FL (US)

(73) Assignee: Silent Partner Group of Companies, Inc., Tampa, FL (US)

( * ) Notice: Subject to any disclaimer, the term of this patent is extended or adjusted under 35 U.S.C. 154(b) by 0 days.

(21) Appl. No.: 17/304,224

(22) Filed: Jun. 16, 2021

(51) Int. Cl.
*H02J 3/38* (2006.01)
*H05K 7/20* (2006.01)
*G05B 15/02* (2006.01)

(52) U.S. Cl.
CPC .............. *H02J 3/381* (2013.01); *G05B 15/02* (2013.01); *H05K 7/20218* (2013.01)

(58) Field of Classification Search
CPC ...... H02J 3/381; G05B 15/02; H05K 7/20218
See application file for complete search history.

(56) References Cited

U.S. PATENT DOCUMENTS

| | | | | |
|---|---|---|---|---|
| 8,606,548 B2 * | 12/2013 | Webster | .................. | G06Q 10/06 703/1 |
| 8,655,939 B2 * | 2/2014 | Redlich | ............... | H04L 63/0227 709/201 |
| 9,624,913 B2 * | 4/2017 | Friesth | ...................... | F03G 7/04 |
| 2012/0137877 A1 * | 6/2012 | Zauderer | ................ | H02K 44/18 95/42 |
| 2013/0042594 A1 * | 2/2013 | Zauderer | .............. | H02K 44/085 60/218 |
| 2015/0120359 A1 * | 4/2015 | Dongieux | ............. | G06F 16/285 705/7.15 |
| 2016/0045841 A1 * | 2/2016 | Kaplan | .................. | B01D 53/48 429/49 |
| 2018/0347406 A1 * | 12/2018 | Friesth | ................... | F01K 25/00 |
| 2020/0135345 A1 * | 4/2020 | Kutsch | ................ | F28D 20/0039 |

* cited by examiner

*Primary Examiner* — Ramesh B Patel
(74) *Attorney, Agent, or Firm* — Smith & Hopen, P.A.; Paul Murty (57) ABSTRACT

A master system for collocated, grid-independent energy generation and usage outside of a typical energy grid dependent system. The system uses a short-coupled delivery system between generation, storage and usage points to prevent line and system energy losses. As a result, the system generates and promotes hyper-efficient end use of electrical and thermal energy, as well as waste products produced during energy generation. Moreover, as a closed system, all waste energy can be reused and/or repurposed within the system, thereby promoting higher energy efficiencies. The versatility of the system is such that it can be implemented across any application that requires efficient energy storage and consumption, especially those involving higher levels of security and control.

17 Claims, 8 Drawing Sheets

CLOSED CLEAN ENERGY GENERATION AND REUSE SYSTEM FOR USE IN MISSION CRITICAL FACILITIES

BACKGROUND OF THE INVENTION

1. Field of the Invention

This invention relates, generally, to energy and energy systems. More specifically, it relates to a clean energy generation and reuse system that utilizes clean energy and integrates the reuse of typically wasted energy by directly integrating the energy generation, capture, and storage points with a use point within a closed system.

2. Brief Description of the Prior Art

Currently, mission critical facility primary energy systems typically require participation in an electrical grid system, in which an end-user's facility receives energy from either a shared or dedicated line within a larger energy infrastructure system. So long as the energy flow remains uninterrupted, the facility experiences near-constant energy supplies and does not suffer from losses in power. However, due to variances in energy demand, downstream facilities often experience outages, such as blackouts or brownouts, which can be caused by voltage drops, short circuiting, or damage to system components. During such outages, which are typically outside of an individual consumer's control, facilities must rely on backup energy stored on-site, if present. If no local energy stores exist, or the local store is exhausted, the facility loses power and enters an offline state. If the facility is a mission critical facility, in particular, such an outage and offline state can be devastating not only to the facility and its stakeholders, but also to downstream users who rely on the mission critical facility.

Concurrently with the above noted inefficiencies, the interruption of continually provided and conditioned power from the existing major electrical grid systems to downstream facilities has continued to experience greater instances of service interruption caused by the malicious infiltration of electrical grid systems and generating facilities by third parties, with the primary intent of disrupting or completely shutting down the affected grid system or facility. Mission critical facilities cannot afford to be without constant, consistent, and uninterrupted power supplies, and are not able to withstand either intermittent or continual interruption of the facility power supplies due to an ineffective and insecure third party controlled off-site energy supply system or source.

In addition to the challenges outlined above, traditional electrical grid systems suffer from inefficient energy transmission and usage due to wasted energy and other energy losses. As such, typical electrical grids can be described as inefficient and/or unclean with respect to energy generation and consumption. These high energy losses, unclean power supplies, and poor energy performance results in inefficient storage and usage systems, as well as inefficient facilities that ultimately use the energy. For mission critical facilities, this results in inadequate and ineffective power usage effectiveness (PUE).

Further to the above noted challenges and deficiencies within the current art, present standard and typical processes of traditional fossil fuel-based energy generation facility programs and systems seldom, if at all, address or manage the vast potential of capturing and reusing the waste carbon dioxide ($CO_2$) gas which is generated during the thermal and/or chemical processes of converting carbon-based fossil fuels into usable electrical or thermal energy. Archetypally, such generated waste $CO_2$ gas is removed from the produced waste gas mixtures by various sequestering and/or scrubbing methods and then disposed of in a manner which is prescribed by the specific sequestration and/or scrubbing process used to sequester the $CO_2$ gas. Alternatively, certain energy generation facilities simply release the produced waste $CO_2$ gas into the atmosphere, which is even more damaging to the environment. Neither of the above processes is an effective, efficient, or environmentally responsible method for the management and control of the produced waste $CO_2$ gas.

Accordingly, with respect to the lack of combined and collocated efficient and effective energy generation and reuse systems, what is needed is a closed clean energy system that is collocated with the end use facilities, such as a mission critical facility, such that waste $CO_2$ gas is captured, stored and recycled either through the closed system for further either energy generation or transferred to third-party $CO_2$ vendors, thereby preventing the waste $CO_2$ gas from simply being released into the ecosystem or environment at a site level. What is also needed is an efficient and effective method of storing and distributing that reusable $CO_2$ gas without loss within a collocated $CO_2$ storage and energy usage facility. However, in view of the current art considered as a whole at the time the present invention was made, it was not obvious to those of ordinary skill in the field of this invention how the shortcomings of the prior art could be readily overcome.

All referenced publications are incorporated herein by reference in their entirety.

Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicant in no way disclaims these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for an integrated mission critical facility having collocated energy generation, storage, and usage systems, incorporating carbon ($CO_2$) capture, storage, and reuse systems, is now met by a new, useful, and nonobvious invention.

The novel collocated energy generation, storage, and usage system includes one or more energy generation units each secured to a current transformer via a first electrical micro-grid system. The system also includes an energy storage unit in electrical communication with the current transformer via a second electrical micro-grid system, such that the energy storage unit is configured to receive and store energy from the one or more energy generation units. In an embodiment, the one or more energy generation units is configured to capture an amount of energy ranging from 25 megawatts to 250 megawatts. In another embodiment, four independent energy generation units are disposed within the system. Each of the four independent energy generation units is configured to generate an amount of energy ranging from 25 megawatts to 250 megawatts, such that the energy storage unit is configured to store an amount of energy ranging from 100 megawatts to 1 gigawatt.

A plurality of end-use facilities are electrically coupled to the energy storage unit via a third electrical micro-grid system, such that each of the plurality of end-use facilities is configured to receive and use energy from the energy storage unit. In an embodiment, each of the plurality of facilities is a mission critical facility selected from the group consisting of a data center, an agriculture facility, an aquaculture facility, an industrial facility, a manufacturing facility, and a commercial facility.

In addition, a carbon capture, storage, and distribution system is integrated into each of the one or more energy generation units, such that the carbon capture, storage, and distribution system captures an amount of carbon dioxide produced by the one or more energy generation units for reuse within the system. In an embodiment, a photoelectrochemical processing and renewable energy generation system is in electrical communication with the carbon capture, storage, and distribution system. The photoelectrochemical processing and renewable energy generation system is configured to expose the captured amount of carbon dioxide to photon-based electrical energy to convert the amount of carbon dioxide into a secondary fuel source selected from the group consisting of a renewable liquid fuel source and a renewable gaseous fuel source.

The energy generation units, the energy storage unit, the current transformer, the plurality of end-use facilities, the carbon capture, storage, and distribution system, and the electric micro-grid systems form a closed system that is configured to be independent from a communal electrical grid, and is configured to recycle waste energy within the system to be reused. In an embodiment, the closed system is collocated on a campus having a one-mile radius.

An embodiment of the system includes a cooling component disposed within at least one of the one or more energy generation units and the plurality of facilities. The cooling component includes a water reservoir with an amount of water therein. The cooling component is configured to remove heat produced within the system by flowing the amount of the water throughout the system via one or more of the first, second, and third electrical micro-grid systems. In an embodiment, the amount of water within the water reservoir of the cooling component includes freshwater, and the water reservoir is in fluidic communication with an underground water supply including freshwater. In another embodiment, the amount of water within the water reservoir of the cooling component includes saltwater, and wherein the water reservoir is in fluidic communication with a body of water including saltwater.

The novel method of capturing, routing, and using energy in a collocated mission critical facility and energy system includes a step of disposing an energy storage unit at a location that is independent from a collective electrical grid. The energy storage unit is connected to each of a plurality of mission critical facilities that are collocated with the energy storage unit within a limited geographic scope. At least one energy generation unit is also disposed within the limited geographic scope, such that the at least one energy generation unit is collocated with each of the energy storage unit and the plurality of mission critical facilities. The method includes a step of forming a closed system between the at least one energy generation unit, the energy storage unit, and the plurality of mission critical facilities.

The at least one energy generation unit generated an amount of energy usable within the closed system. A carbon capture, storage, and distribution system that is integrated into the at least one energy generation unit captures an amount of carbon dioxide produced by the at least one energy generation unit. The captured carbon dioxide is transferred to a photoelectrochemical processing and renewable energy generation system that is in electrical communication with the carbon capture, storage, and distribution system.

The method includes a step of exposing the captured amount of carbon dioxide to photon-based electrical energy to convert the amount of carbon dioxide into a secondary fuel source selected from the group consisting of a renewable liquid fuel source and a renewable gaseous fuel source.

In an embodiment, the method includes a step of removing an amount of excess heat from the system by flowing an amount of water through the system, the amount of water stored within a water reservoir disposed within a cooling component disposed within at least one of the one or more energy generation units and the plurality of facilities. The method includes a step of capturing an amount of replacement water from a water source and storing, within the water reservoir, the captured amount of replacement water for excess heat removal from the system.

The method includes a step of disposing an energy micro-grid distribution system within the limited geographic scope that is independent from a collective public electrical grid. The energy micro-grid distribution systems are connected to each of a plurality of mission critical facility systems that are collocated with the energy generation and distribution systems within an immediate and limited geographic scope. A closed system is formed between the energy generation and micro-grid distribution systems and the plurality of mission critical facility systems.

In an embodiment thereof, the method includes the steps of capturing an amount of carbon from an amount of waste gaseous products generated by the collocated mission critical facility and/or energy generations systems and transferring the captured amount of carbon in a usable format, in the form of gaseous $CO_2$ to the carbon capture storage unit for redistribution. After the step of transferring the captured carbon, the method includes a step of transferring the captured carbon from the energy storage unit to at least one or more of the mission critical facility's closed loop $CO_2$ reuse and/or redistribution systems via a $CO_2$ purposed mechanical or plumbing system line.

In another embodiment thereof, the method includes the steps of capturing amounts of carbon, in gaseous form, from an amount of waste gaseous products generated by the collocated mission critical facility's energy generation systems and transferring that captured amount of carbon in a usable/reusable format, in the form of gaseous $CO_2$, to a photo-catalytic or and/or photoelectrochemical processing system for conversion into a reusable fuel source integrated with the mission critical facility's energy generation systems. Following the step of transferring the captured carbon, in a gaseous form, to the photo-catalytic and/or photoelectrochemical system, the method includes a step of transferring the generated renewable fuel source(s), in its/their gaseous form, to the energy generation unit, wherein such generated renewable fuel will be used to generate additional energy, in the form of either, or both, electrical or thermal energy, within the closed system.

An object of the invention is to transform inefficient energy systems of the prior art that rely on typical public power grids, instead utilizing collocated energy generation, storage, distribution and usage systems implemented in a closed system to prevent energy waste, instead reusing waste energy within the system. Another object of the invention is to implement mission critical facilities that exist outside of traditional grid dependent systems, instead relying on a grid independent collocated energy system that reduces waste and improves efficiency and effectiveness of the entire system as a whole.

These and other important objects, advantages, and features of the invention will become clear as this disclosure proceeds.

The invention accordingly comprises the features of engineering, design, construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

The present invention includes a master system for collocated energy generation and usage outside of a typical energy grid system. The master system is a closed energy generation system encompassing simultaneous primary and redundant generation capabilities, comprised of separate, yet interconnected, energy generating units of varying standard and hybrid types which are integrated into the facility control and energy management systems to meet a mission critical facility's specifically engineered effective and efficient energy generation and consumption requirements. The system uses a short-coupled delivery system between storage and usage points to prevent line and system energy losses. As a result, the system generates and promotes hyper-efficient end use of electrical and thermal energy. Moreover, as a closed system, all waste energy can be reused within the system, thereby promoting further energy efficiencies. The versatility of the system is such that it can be implemented across any application that requires efficient energy storage and consumption.

While the idea of an off-grid energy system exists within the art, no comprehensive solution exists for an entirely closed off-grid system in which waste energy is conserved, captured, and reused within the system, thereby preventing system effectiveness and efficiency failures. In addition, no comprehensive solution exists for an off-grid mission critical facility, including collocated energy stores for consumption, as well as critical data for system functionality. As such, there is an unmet need within the industry for a full-scale off-grid energy system that prevents system failures caused by energy demand fluctuations, thereby maintaining a mission critical facility in an online state at all times. The comprehensive system and method of efficiently storing and using energy within a closed system collocated with a mission critical facility without producing waste energy will be described in greater detail in the sections below.

Figure 1:
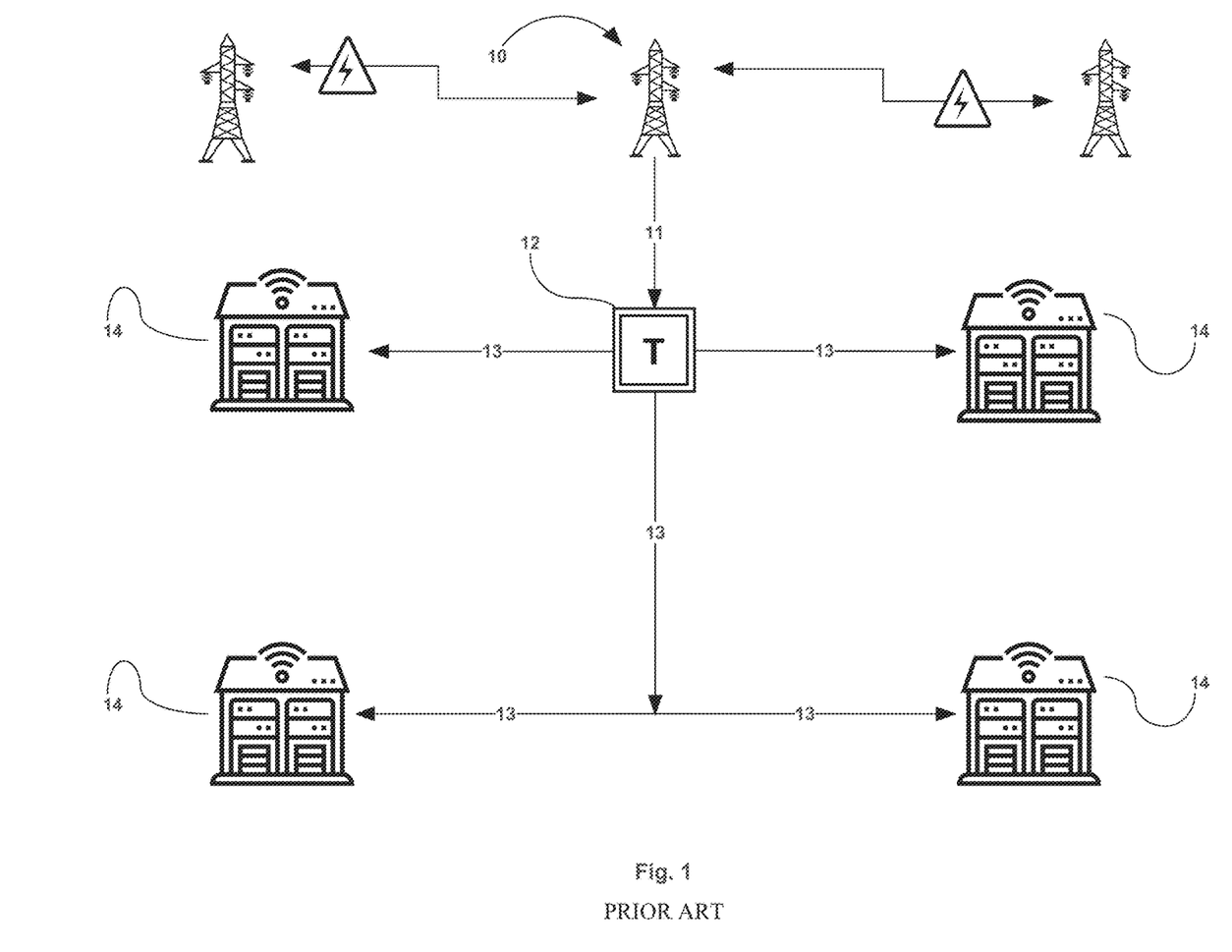
FIG. 1 is a perspective view of a prior art grid-connected/grid-dependent mission critical data center campus facility system.

As shown in FIG. 1, which is a perspective view of a prior art system, standard and typical grid-connected/grid-dependent mission critical data center campus facility system includes local electrical grid system 10; with facility interconnect 11 that connects to local electrical grid 10; site transformer system 12 that receives electrical energy from local electrical grid system 10 via facility interconnect 11; and a plurality of electric micro-grids 13 that distribute grid supplied electricity from local electrical grid system 10 to the end use mission critical elements, including, but not limited to, data center facilities 14. Each of these components will be described in greater detail herein below.

As shown in in FIG. 1, a standard and typical energy grid dependent system includes a primary energy supply provided by the local electrical grid system 10 through facility interconnect 11 that is in electrical communication with a site-specific electrical transformer system 12, which distributes grid dependent energy through a collocated site specific electric micro-grid 13 to a single or plurality of facilities 14, each of which functions as an energy end usage unit. In particular, a standard and typical grid dependent system is disposed such that consumable energy flows between the local electrical grid system 10 directly to each of the singular or plurality of facilities 14, depending on the requirements of the system at a given moment.

Importantly, the local electrical grid system 10 is not a site controlled system, but rather is entirely dependent upon an unrelated third-party to provide the constant and uninterrupted energy supply, which may be delivered as unconditioned energy through any number of inefficient energy generation stations which are located substantially distant from the singular or plurality of facilities 14. As such, as shown in FIG. 1, energy flowing through the system is not preserved within the system, other than the energy used at each of the plurality of facilities 14, with substantial line losses being prevalent and inefficiencies experienced due to the distances the energy travels from its point of origin to its point of end use within a single or plurality of facilities 14. Energy that would typically be wasted, emitted or exhausted from the system as waste energy is both uncontrolled and lost within the system, with no option for its effective capture for future usage or reusage. The system thereby lacks efficiencies within the prior art by not ensuring that typically wasted energy can be reused instead of vented or lost, creating a highly inefficient energy system.

Turning now to FIGS. 2-7, embodiments of the closed collocated energy system include energy generation units 21, 31, 41, 51, 61, and 71, storage units 34, 47, 56, 67, and 76, and a singular or plurality of facilities 26, 36, 49, 58, 69, and 78. As used within the embodiments of the invention's system, the plurality of facilities 26, 36, 49, 58, 69 and 78 may be mission critical facilities, such as data centers, agri-tech facilities, aquaculture facilities, industrial facilities, manufacturing facilities, and other commercial facilities. Mission critical facilities require a consistent and uninterrupted flow of energy thereto, thereby ensuring that the facility remains online as consistently as possible. As such, mission critical facilities face a particular need for access to dedicated energy stores without relying on traditional third-party faulty, unsecured and inefficient electricity grids. In such embodiments, the mission critical facilities of the singular or plurality of facilities 26, 36, 49, 58, 69, and 78 receive a constant flow of energy from the energy generation units 21, 31, 41, 51, 61, and 71, as well as from storage units 34, 47, 56, 67, and 76 whenever energy consumption is required, without suffering from any down time, which could lead to critical system failures if they occurred.

In addition, as shown in FIGS. 2-7, embodiments of collocated energy generation systems 21, 31, 41, 51, 61, and 71, as well as storage units 34, 47, 56, 67, and 76, reside within a defined and limited geographic area, such as campus 20, 30, 40, 50, 60, and 70. As such, each of the singular or plurality of facilities 26, 36, 49, 58, 69, and 78 resides in close proximity to one another, such that an embodiment of campus 20, 30, 40, 50, 60, and 70 is limited in size to not more than approximately a one-mile radius. However, it should be appreciated that campus 20, 30, 40, 50, 60, and 70 may vary in size depending on the technological requirements and specifications of the client and facility system, such that the entire system is scalable and versatile to implementations of varying sizes, from the energy generation systems 21, 31, 41, 51, 61, and 71 through the end use singular or plurality of facilities 26, 36, 49, 58, 69, and 78.

Figure 2:
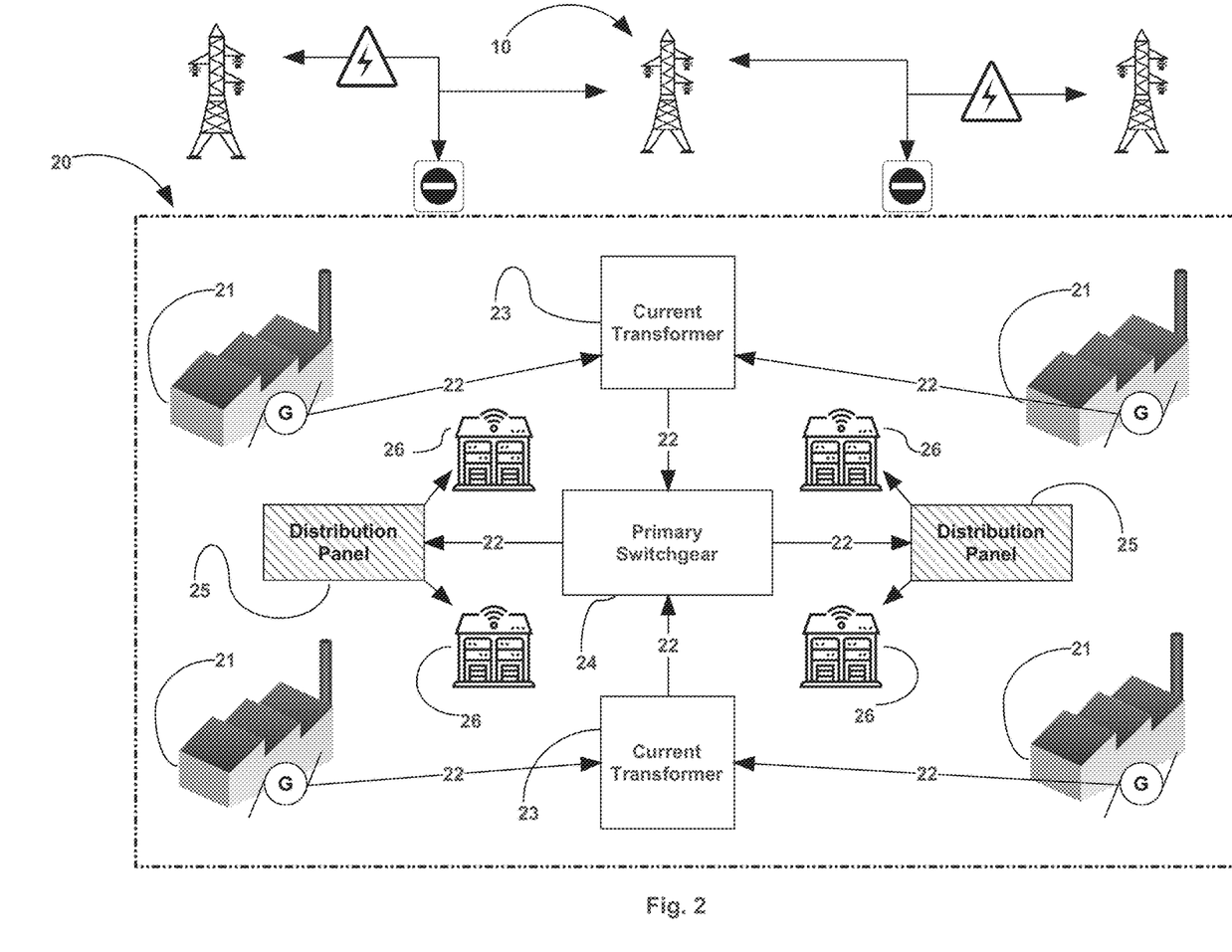
FIG. 2 is a perspective view of a basic grid-independent, collocated energy generation, distribution, and usage system, in accordance with an embodiment of the present invention.

Turning now to FIG. 2 in particular, an embodiment of a single or plurality of collocated, grid-independent energy generation system 21 is in direct electrical communication through a site specific electrical micro-grid system 22 with a single or plurality of grid-independent and site-specific current transformer 23. Transformer 23 is in turn electrically coupled to site specific primary switchgear 24, which is in electrical communication with a singular or plurality of distribution panel 25 via a site specific electrical micro-grid system 22. The singular or plurality of distribution panel 25 is electrically connected to an end use singular or plurality of facility 26. As such, the components disposed within campus 20 do not rely on external, grid-dependent, third-party energy generation components 10 which are outside of the control of the stakeholders of campus 20.

If relying on such an external, grid-dependent, third-party local electrical grid system 10, campus 20 would remain constantly vulnerable to inconsistencies in energy generation and energy distribution to and throughout campus 20 and its component systems, (namely, collocated energy generation system 21; electrical micro-grid system 22; site-specific current transformer 23; site-specific primary switchgear 24; distribution panel 25; and, most importantly, facility 26). Instead, campus 20 includes grid-independent collocated energy generation system 21 that is also collocated with grid-independent electrical micro-grid system 22, current transformer 23, primary switchgear 24, distribution panel 25, and the singular or plurality of facilities 26, such that not only are the energy generation, transfer and usage components collocated within a closed, local system disposed on campus 20, but also the energy generation components are locally proximal to and reside within a stakeholder controlled closed system represented by campus 20. In this embodiment, the plurality of components (collocated energy generation system 21; electrical micro-grid system 22; site-specific current transformer 23; site-specific primary switchgear 24; distribution panel 25; and facility 26) reside in deployable modular blocks within campus 20 with energy generation capacities ranging from approximately 25 MW to 250 MW; in addition, in an embodiment, a maximum single system disposed on campus 20 includes the capability of a quad-module distributed energy generation capacity of 1 GW, utilizing four energy generation systems 21 to provide energy to the system.

Figure 3:
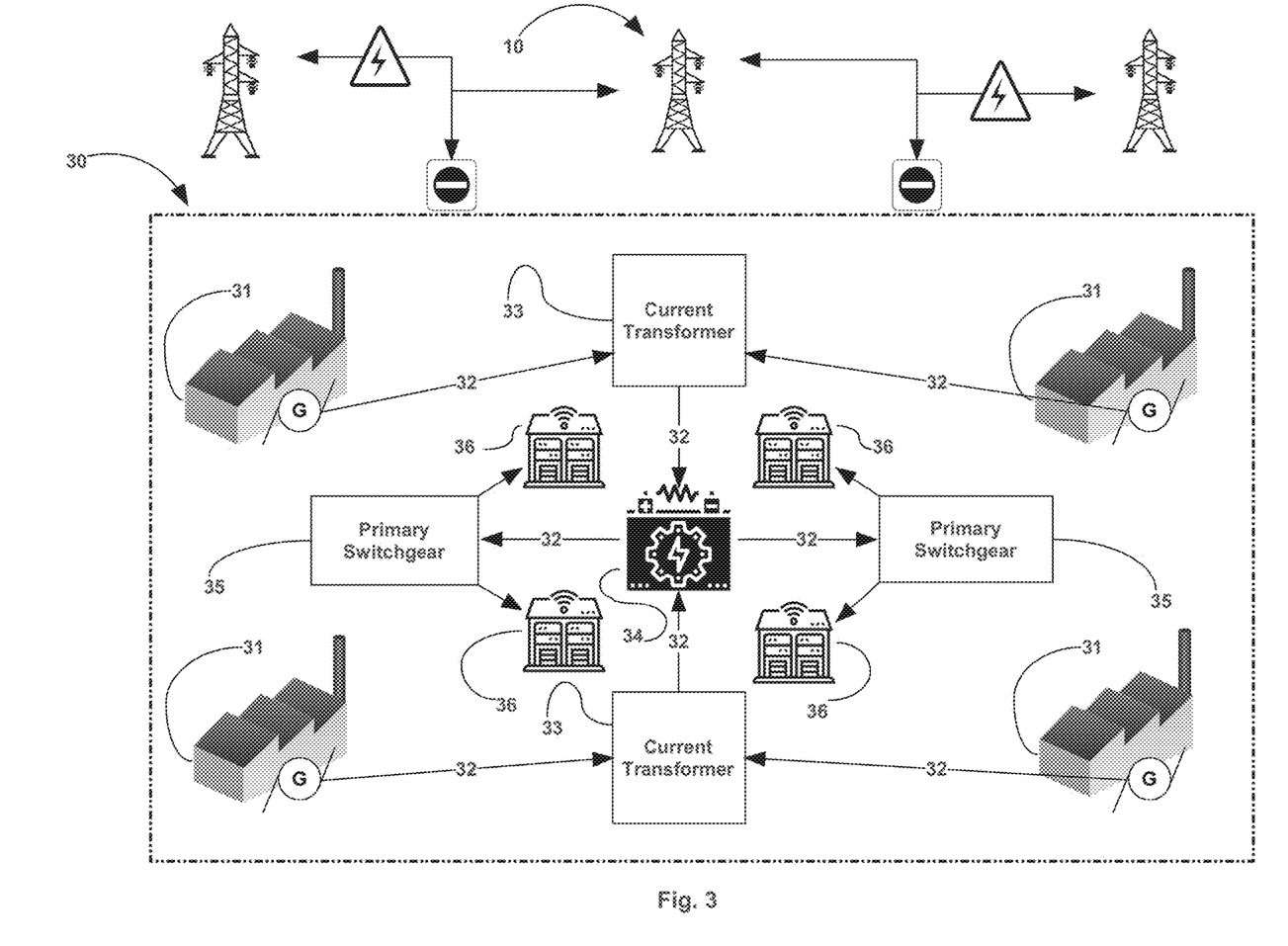
FIG. 3 is a perspective view of a grid-independent, collocated, and integrated energy generation, storage, distribution, and usage system, in accordance with an embodiment of the present invention.

Referring now to FIG. 3, an embodiment of the system utilizes the benefits initially defined by the embodiment shown in FIG. 2 (described above), and further increases the efficiencies of a collocated grid-independent system disposed on campus 30 by integrating energy storage unit 34 therein. Within campus 30, a single or plurality of collocated, grid-independent energy generation system 31 is in direct electrical communication with energy storage system 34 via electrical micro-grid system 32 that is capable of transferring electrical energy to a single energy storage unit 34. In addition, electrical micro-grid system 32 transfers both direct and stored electrical energy to a single or plurality of grid-independent and site-specific current transformer 33 and site-specific primary switchgear 35, and ultimately to the end use singular or plurality of facility 36.

As such, campus 30 also does not rely on an external, grid-dependent, third-party local electrical grid system 10, which are outside of the control of the stakeholders of campus 30, and thereby accomplishes similar energy generation capacities ranging from approximately 25 MW to 250 MW; in addition, in an embodiment, a maximum single system disposed on campus 30 includes the capability of a quad-module distributed energy generation capacity of 1 GW, utilizing four energy generation systems 31 to provide energy to the system.

Figure 4:
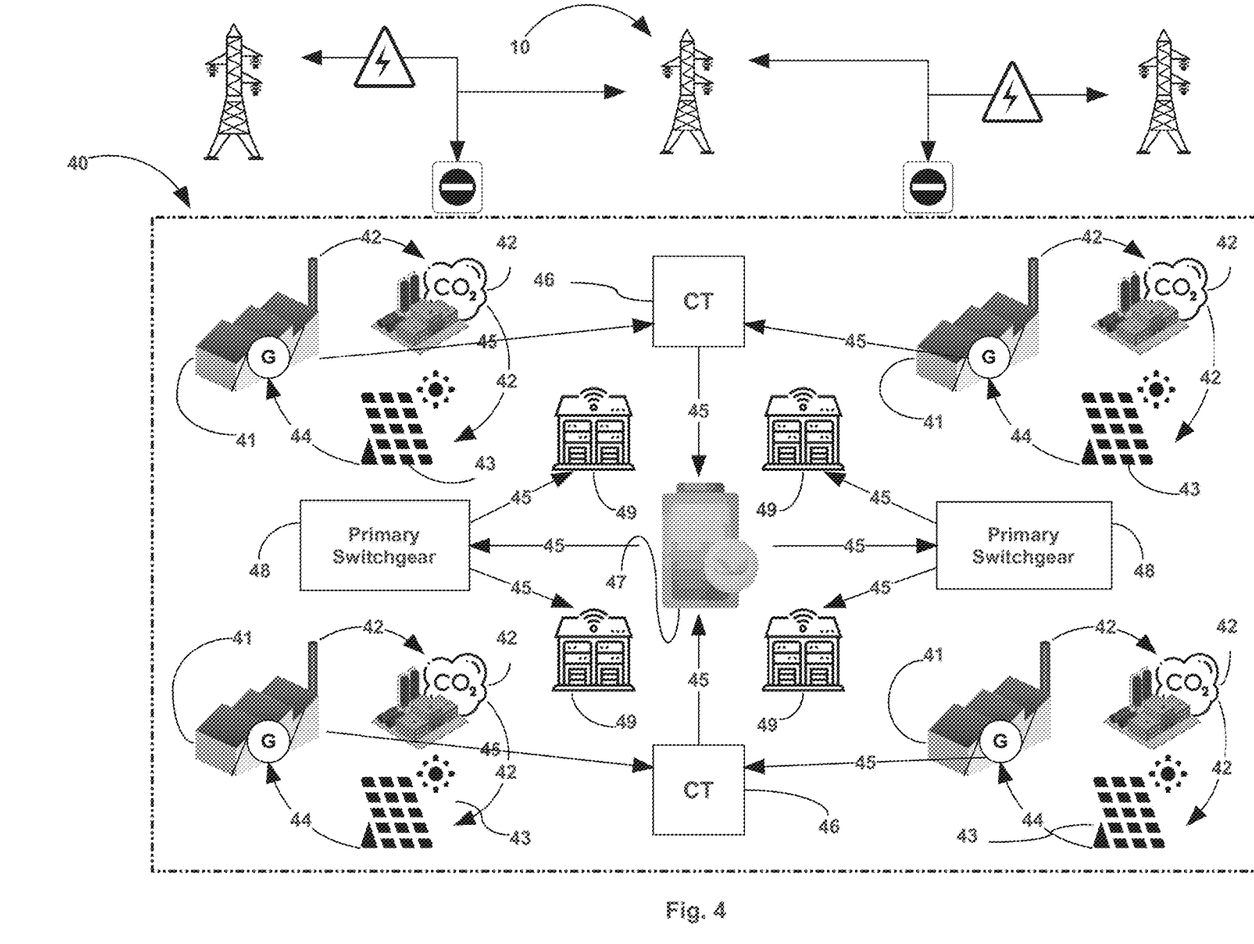
FIG. 4 is a perspective view of a grid-independent, collocated, and integrated energy generation, carbon capture, and reuse, eco-friendly, and high-efficiency energy storage, distribution and usage system, in accordance with an embodiment of the present invention.

Referring now to FIG. 4, an embodiment of the system utilizes the benefits initially defined by FIG. 3 above, then further increases the efficiencies of the collocated grid-independent system disposed on campus 40 by integrating $CO_2$ capture, storage, and distribution system 42 and photo-catalytic and/or photoelectrochemical processing and renewable energy generation system 43, along with renewable energy storage and distribution system 44. Now, within the system disposed on campus 40, a single or plurality of collocated, grid-independent energy generation system 41 is in direct electrical communication with a single or plurality of current transformer 46 via electrical micro-grid system 45, which in turn is in direct electrical communication with energy storage unit 47 via a separate electrical micro-grid system 45. As such, electrical micro-grid system 45 transfers both direct and stored electrical energy to a single or plurality of grid-independent and site-specific primary switchgear 48, and ultimately to the end use singular or plurality of facility 49.

Likewise, grid-independent energy generation system 41 is in both mechanical and electrical communication with closed loop $CO_2$ capture, storage, and distribution system 42, through which the waste off-gasses produced by energy generation system 41 are processed. The waste $CO_2$, in its gaseous form, is captured therefrom, then stored and redistributed within the closed loop of carbon dioxide capture system 42 to a closed loop photo-catalytic and/or photoelectrochemical processing and renewable energy generation system 43. Within a collocated, closed loop photo-catalytic and/or photoelectrochemical processing and renewable energy generation system 43, the captured waste $CO_2$ gas from energy generation system 41 is directly exposed to photon-based electrical and/or thermal energy which has been generated, stored and redistributed by and through the closed loop processing of renewable energy generation system 43 to convert the waste $CO_2$ gas into a renewable liquid and/or gaseous secondary fuel source, including, but not limited to, methane. The secondary fuel source is configured to be burned/reused within energy generation system 41 to generate additional electrical and thermal energy to be further distributed and used within the components of the system disposed on campus 40.

Equally, as with the system disposed on campus 30 (FIG. 3, described above), the system of the embodiment of FIG. 4 also does not rely on external, grid-dependent, third-party local electrical grid system 10 which are outside of the control of the stakeholders of campus 40. In addition, efficiency levels are increased as the system disposed on campus 40 integrates grid-independent energy generation system 41, closed loop $CO_2$ capture and storage system 42, closed loop photo-catalytic and/or photoelectrochemical processing and renewable energy generation system 43, and renewable fuel storage and distribution system 44, to effectively convert site-generated waste material, in the form of $CO_2$ gas, to a renewable fuel source, thereby reducing an interdependence on fossil fuels to generate electrical and thermal energy within the system.

Moreover, the system disposed on campus 40 further integrates energy storage unit 47 to additionally enhance integrated energy efficiencies for the system's components as discussed above, such that not only are the energy generation, transfer, storage, and usage components collocated within a closed, local campus 40, but also the energy generation, waste capture, storage, and reuse components are all locally proximal to and reside within a stake-holder controlled closed system disposed on campus 40. In this embodiment, with the system disposed on campus 40 includes energy generation capacities ranging from approximately 25 MW to 250 MW; in addition, in an embodiment, a maximum single system disposed on campus 40 includes the capability of a quad-module distributed energy generation capacity of 1 GW, utilizing four energy generation systems 41, four $CO_2$ capture, storage and reuse modules 42, and four renewable fuel generation modules 43, to efficiently and consistently provide energy to the system.

Figure 5:
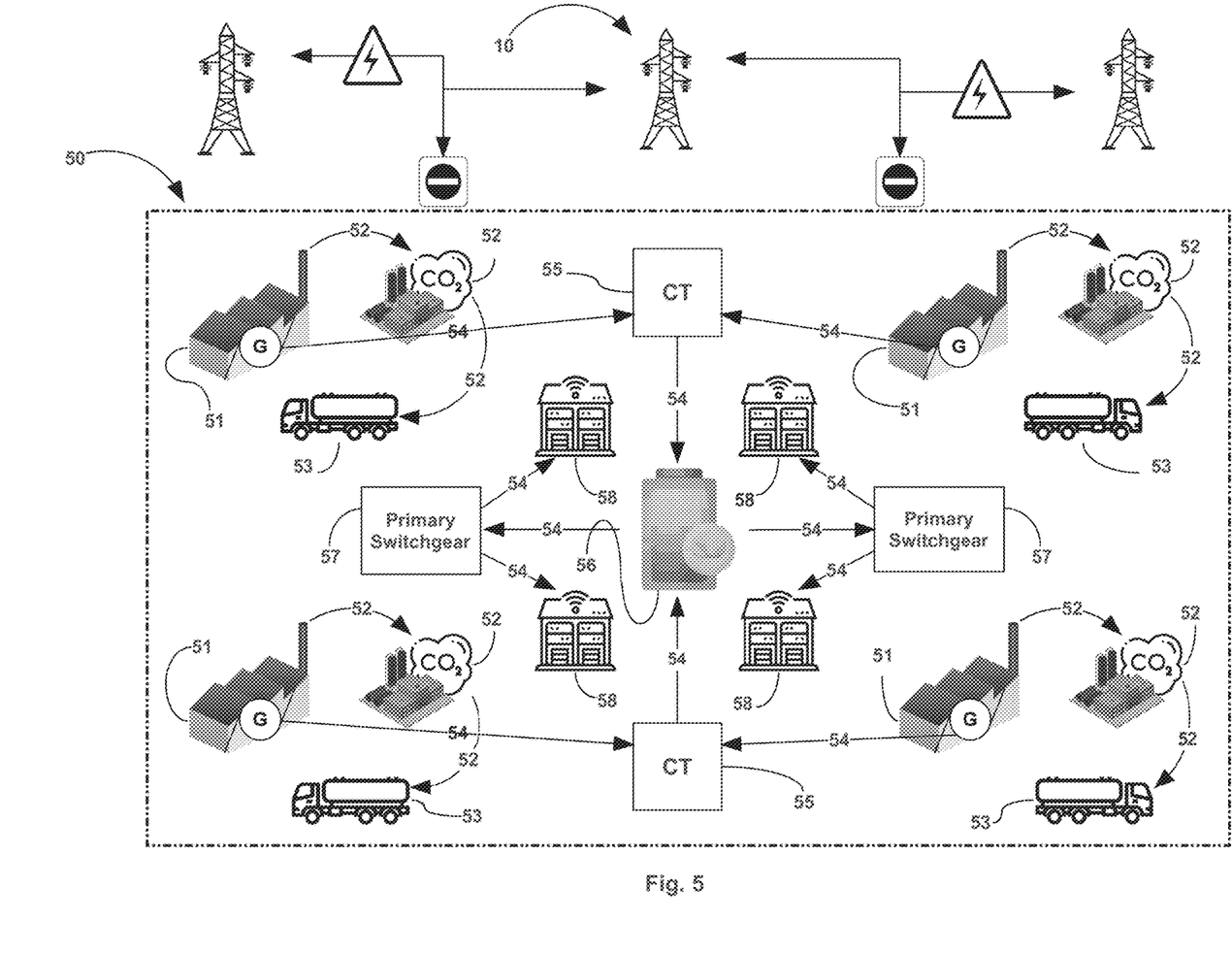
FIG. 5 is a perspective view of a grid-independent, collocated, and integrated energy generation, carbon capture, and reuse, eco-friendly, and high-efficiency energy storage, distribution, and usage system, in accordance with an embodiment of the present invention.

Referring now to FIG. 5, an embodiment of the system integrates a portion of the system benefits defined by the embodiment shown in FIG. 4 (described above); however, the system disposed on campus 50 primarily targets secondary efficiency benefits derived from specifically removing the $CO_2$ waste product generated by a single or plurality of collocated, grid-independent energy generation system 51 and processed through an integrated $CO_2$ capture, storage and distribution system 52, without incorporating photo-catalytic and/or photoelectrochemical processing and renewable energy generation systems. The energy generation system 51 is in direct electrical communication with a single or plurality of current transformer 55 via electrical micro-grid system 54, with current transformer 55 being in direct electrical communication with energy storage unit 56 via a separate electrical micro-grid system 54. As such, electrical micro-grid system 54 transfers both direct and stored electrical energy to a single or plurality of grid-independent and site-specific primary switchgear 57, and ultimately to the end use singular or plurality of facility 58.

Likewise, grid-independent energy generation system 51 is in both mechanical and electrical communication with closed loop $CO_2$ capture, storage, and distribution system 52, through which the waste off-gasses produced by energy generation system 51 are processed and the waste $CO_2$, in its gaseous form, is captured therefrom, then stored and redistributed within the closed loop of carbon dioxide capture system 52 to a distribution and logistics system 53 for the sale of and external redistribution of facility 50 generated waste $CO_2$ to third-party purchasers.

Similar to the systems disposed on each of campus 30 (FIG. 3) and campus 40 (FIG. 4), the system of the embodiment of FIG. 5 also does not rely on external, grid-dependent, third-party local electrical grid system 10 which are outside of the control of the stakeholders of campus 50. system in addition, efficiency levels are increased through the removal of reusable waste products, as the system integrates grid-independent energy generation system 51, closed loop $CO_2$ capture, storage, and distribution system 52, and closed loop distribution and logistics system 53, to effectively convert site-generated waste material, in the form of $CO_2$ gas, into a marketable and reusable energy product, creating a reduction of the carbon footprint of campus 50.

Moreover, the system disposed on campus 50 further integrates energy storage unit 56 to additionally enhance integrated energy efficiencies for the system's components as discussed above, such that not only are the energy generation, transfer, storage and usage components collocated within a closed, local campus 50, but also the energy generation and waste $CO_2$ capture, storage and, distribution components are all locally proximal to and reside within a stakeholder controlled closed system disposed on campus 50. In this embodiment, the system disposed on campus 50 includes energy generation capacities ranging from approximately 25 MW to 250 MW; in addition, in an embodiment, a maximum single system disposed on campus 50 includes the capability of a quad-module distributed energy generation capacity of 1 GW, utilizing four energy generation systems 51, four $CO_2$ capture, storage, and distribution modules 52, and four waste $CO_2$ distribution modules 53, to efficiently generate energy and reduce greenhouse gas emissions within the system.

Figure 6:
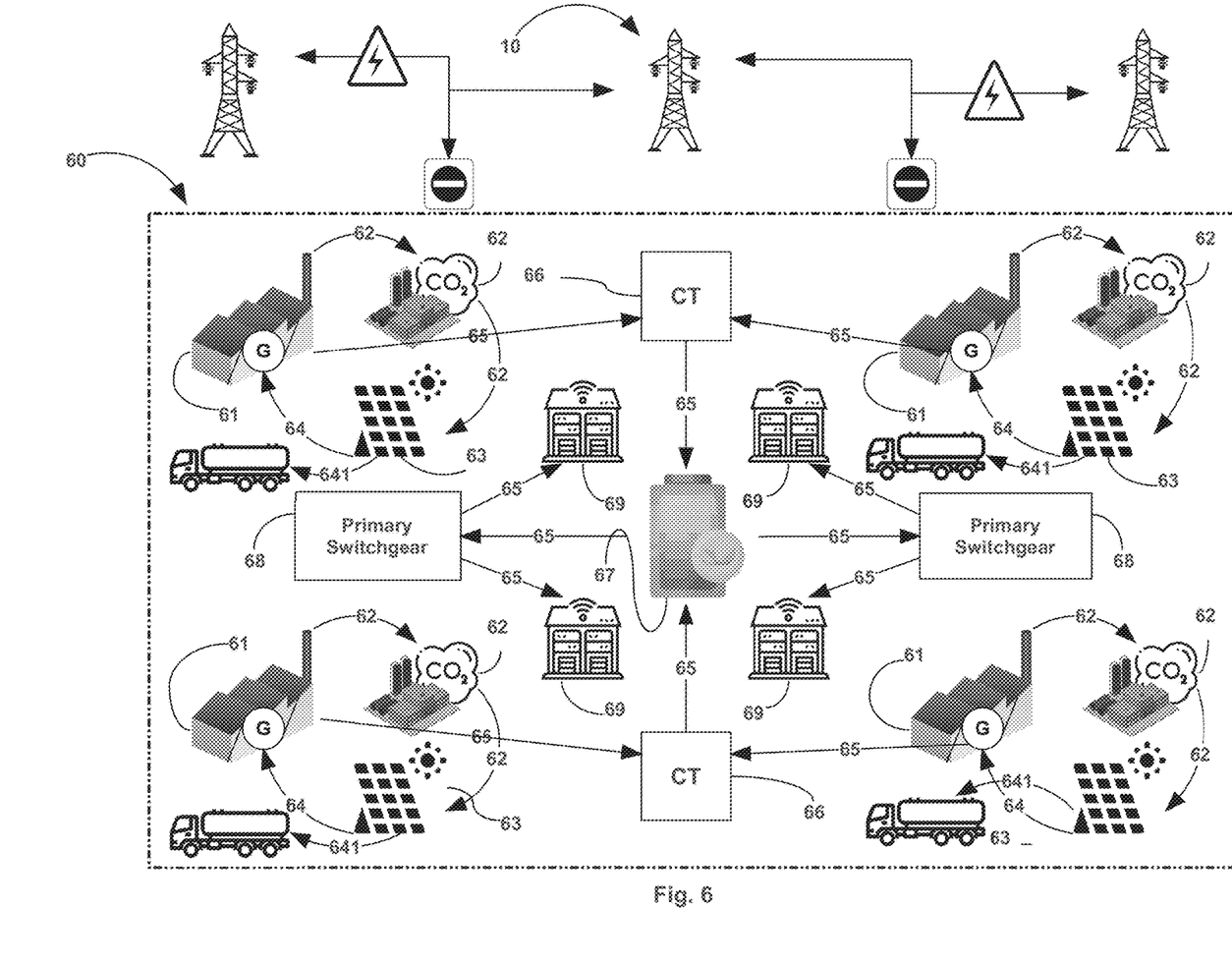
FIG. 6 is a perspective view of a grid-independent, collocated, and integrated energy generation, carbon capture, and reuse, eco-friendly, and high-efficiency energy storage, distribution, and usage system, in accordance with an embodiment of the present invention.

Referring now to FIG. 6, an embodiment of the system utilizes the benefits initially defined by the embodiment of FIG. 4 (described above), further increasing the efficiencies of a collocated grid-independent system disposed on campus 60. Now, within the system disposed on campus 60, a single or plurality of collocated, grid-independent energy generation system 61 is in direct electrical communication with a single or plurality of current transformer 66 via electrical micro-grid system 65, which in turn is in direct electrical communication with energy storage unit 67 via a separate electrical micro-grid system 65. As such, electrical micro-grid system 65 transfers both direct and stored electrical energy to a single or plurality of grid-independent and site-specific primary switchgear 68, and ultimately to the end use singular or plurality of facility 69.

Likewise, grid-independent energy generation system 61 is in both mechanical and electrical communication with closed loop $CO_2$ capture, storage, and distribution system 62, through which the waste off-gasses produced by energy generation system 61 are processed. The waste $CO_2$, in its gaseous form, is captured therefrom, then stored and redistributed within the closed loop of carbon dioxide capture system 62 to a closed loop photo-catalytic and/or photoelectrochemical processing and renewable energy generation system 63. Within a collocated, closed loop photo-catalytic and/or photoelectrochemical processing and renewable energy generation system 63, the captured waste $CO_2$ gas from energy generation system 61 is directly exposed to photon-based electrical and/or thermal energy which has been generated, stored, and redistributed by and through the closed loop processing of renewable energy generation system 63 to convert the waste $CO_2$ gas into a renewable liquid and/or gaseous secondary fuel source, including, but not limited to, methane. The secondary fuel source is configured to be either burned/reused within energy generation system 61 to generate additional electrical and thermal energy to be further distributed and used within the components of the system disposed on campus 60, or sold to third-parties through an external distribution and logistics system 641.

Equally, as with the system disposed on campus 50 (FIG. 5, described above), the system of the embodiment of FIG. 6 also does not rely on external, grid-dependent, third-party local electrical grid system 10 which are outside of the control of the stakeholders of campus 60. Instead, campus 60 integrates grid-independent energy generation unit 61, closed loop $CO_2$ capture and storage system 62, closed loop photo-catalytic and/or photoelectrochemical processing and renewable energy generation system 63, renewable fuel storage and distribution system 64, and external distribution and logistics system 641 to effectively convert site-generated waste material, in the form of $CO_2$ gas, to create an intrinsic circular reuse of facility waste. In addition, the components disposed on campus 60 create a renewable fuel source to reduce an interdependence on fossil fuels by generating electrical and thermal energy within the system, and reduces the carbon footprint of campus by via the extrinsic removal of the waste $CO_2$ gas from the site.

Moreover, the system disposed on campus 60 further integrates energy storage unit 67 to additionally enhance integrated energy efficiencies for the system's components as discussed above, such that, not only are the energy generation, transfer, storage, and usage components collocated within closed, local campus 60, but also the energy generation, waste capture, storage, and reuse components are all locally proximal to and reside within a stakeholder controlled closed system disposed on campus 60. In this embodiment, the system disposed on campus 60 includes energy generation capacities ranging from approximately 25 MW to 250 MW; in addition, in an embodiment, a maximum single system disposed on campus 60 includes the capability of a quad-module distributed energy generation capacity of 1 GW, utilizing four energy generation system 41, four $CO_2$ capture, storage, and reuse modules 62, and four renewable fuel generation modules 63, to efficiently and consistently energize the system.

Figure 7:
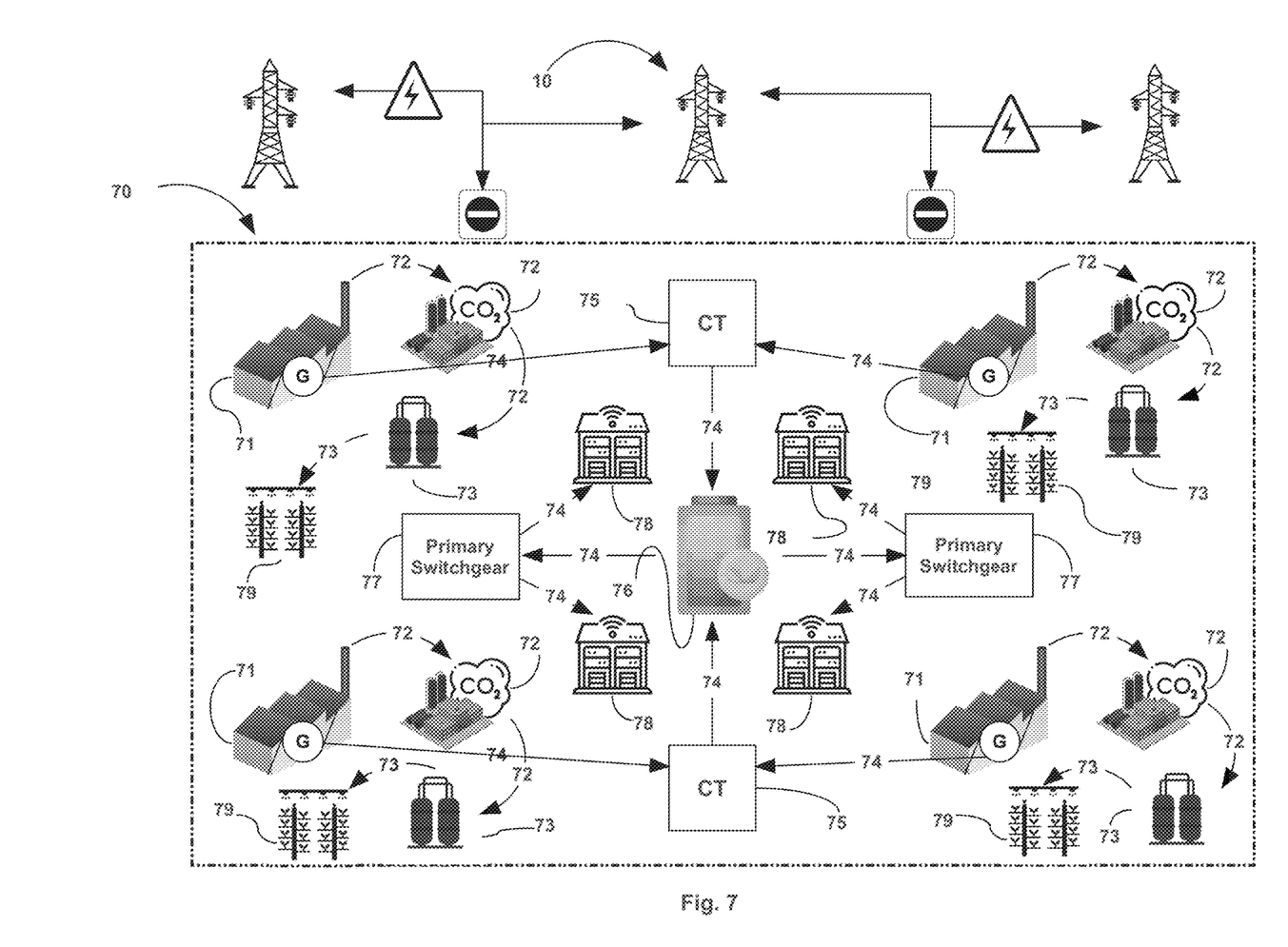
FIG. 7 is a perspective view of a grid-independent, collocated, and integrated energy generation, carbon capture, and reuse, eco-friendly, and high-efficiency energy storage, distribution, and usage system, in accordance with an embodiment of the present invention.

Referring now to FIG. 7, an embodiment of the system integrates a portion of the system benefits defined by the embodiment of FIG. 5 (described above); however, the system disposed on campus 70 primarily targets secondary efficiency benefits derived from specifically reusing the $CO_2$ waste product generated by grid-independent energy generation system 71 and processed through an integrated $CO_2$ capture, storage, and distribution system 72 for consumption within a technologically-advanced agricultural and/or vertical garden system 79.

Within campus 70, a single or plurality of collocated, grid-independent energy generation system 71 is in direct electrical communication with a single or plurality of current transformer 75 via electrical micro-grid system 74, which in turn is in direct electrical communication with energy storage unit 76 via a separate electrical micro-grid system 74. As such, electrical micro-grid system 74 transfers both direct and stored electrical energy to a single or plurality of grid-independent and site-specific primary switchgear 77, and ultimately to the end use singular or plurality of facility 78.

Likewise, grid-independent energy generation system 71 is in both mechanical and electrical communication with closed loop $CO_2$ capture, storage, and distribution system 72, through which the waste off-gasses produced by energy generation system 71 are processed and the waste $CO_2$, in its gaseous form, is captured therefrom, then redistributed within the closed loop of carbon dioxide capture system 72 to an advanced technology processing system 73 to be reused and/or consumed within an advanced technology agricultural and/or vertical garden facility system 79.

As provided within this configuration, the system disposed on campus 70 does not rely on external, grid-dependent, third-party local electrical grid system 10 which are outside of the control of the stakeholders of campus 70. Instead, campus 70 integrates grid-independent energy generation unit 71, closed loop $CO_2$ capture, storage, and distribution system 72, closed loop distribution and processing system 73, and reuse/consumption agricultural and/or vertical garden facility 79 to effectively convert site-generated waste material, in the form of $CO_2$ gas, into a reusable product, creating both a reduction of the carbon footprint of campus 70 and the circular reuse of facility waste within a highly efficient energy generation system 71.

Moreover, the system disposed on campus 70 further integrates energy storage unit 76 to additionally enhance integrated energy efficiencies for the system's components as discussed above, such that, not only are the energy generation, transfer, storage, and usage components collocated within a closed, local campus 70, but also the energy generation, waste $CO_2$ capture, storage, and distribution components 72, advanced technology processing system 73, and advanced technology agricultural and/or vertical garden facility system 79 are all locally proximal to and reside within a stakeholder controlled closed system disposed on campus 70. In this embodiment, with the system includes energy generation capacities ranging from approximately 25 MW to 250 MW; in addition, in an embodiment, a maximum single system disposed on campus 70 includes the capability of a quad-module distributed energy generation capacity of 1 GW, utilizing four energy generation systems 51, four $CO_2$ capture, storage, and distribution modules 72, four advanced technology $CO_2$ processing modules 73, and four advanced technology agricultural and/or vertical garden systems 79, to efficiently generate energy and reduce greenhouse gas emissions within the system.

Moreover, an embodiment of each of campuses 20, 30, 40, 50, 60, 70 includes highly advanced thermal capture and cooling components within facility 26, 36, 49, 58, 69, 78, and 79; it should be appreciated that multiple cooling components may be implemented throughout each of the system, and that such cooling components may be located elsewhere within the systems, such as within energy storage units 34, 47, 56, 67, and 76, as well as $CO_2$ capture and reuse systems 42, 52, 62, and 72, further noting that such cooling components may also be located within energy generation systems 21, 31, 41, 51, 61, and 71. The cooling components include a water source, either internally stored or drawn from a local source; the water source may be freshwater, such as from an underground water supply, or saltwater, such as from a natural body of water in close proximity to one or more of campuses 20, 30, 40, 50, 60, and/or 70.

As one or more of energy generation systems 21, 31, 41, 51, 61, and 71 generate energy, and as one or more of collocated energy storage units 34, 47, 56, 67, and 76 store, transfer, and use energy within its closed system, the cooling component functions to remove excess heat from within the system. Typically, during energy generation, storage and usage, energy is lost to the external environment as waste heat; such energy loss contributes to inefficiencies within the system, requiring the use of an increased energy supply. To accommodate for this and to improve system efficiencies, one or more of campuses 20, 30, 40, 50, 60, and 70 includes cooling components that circulate water throughout the system to remove heat generated during energy consumption, thereby decreasing the energy supply requirements as compared with systems lacking such a cooling component.

Figure 8:
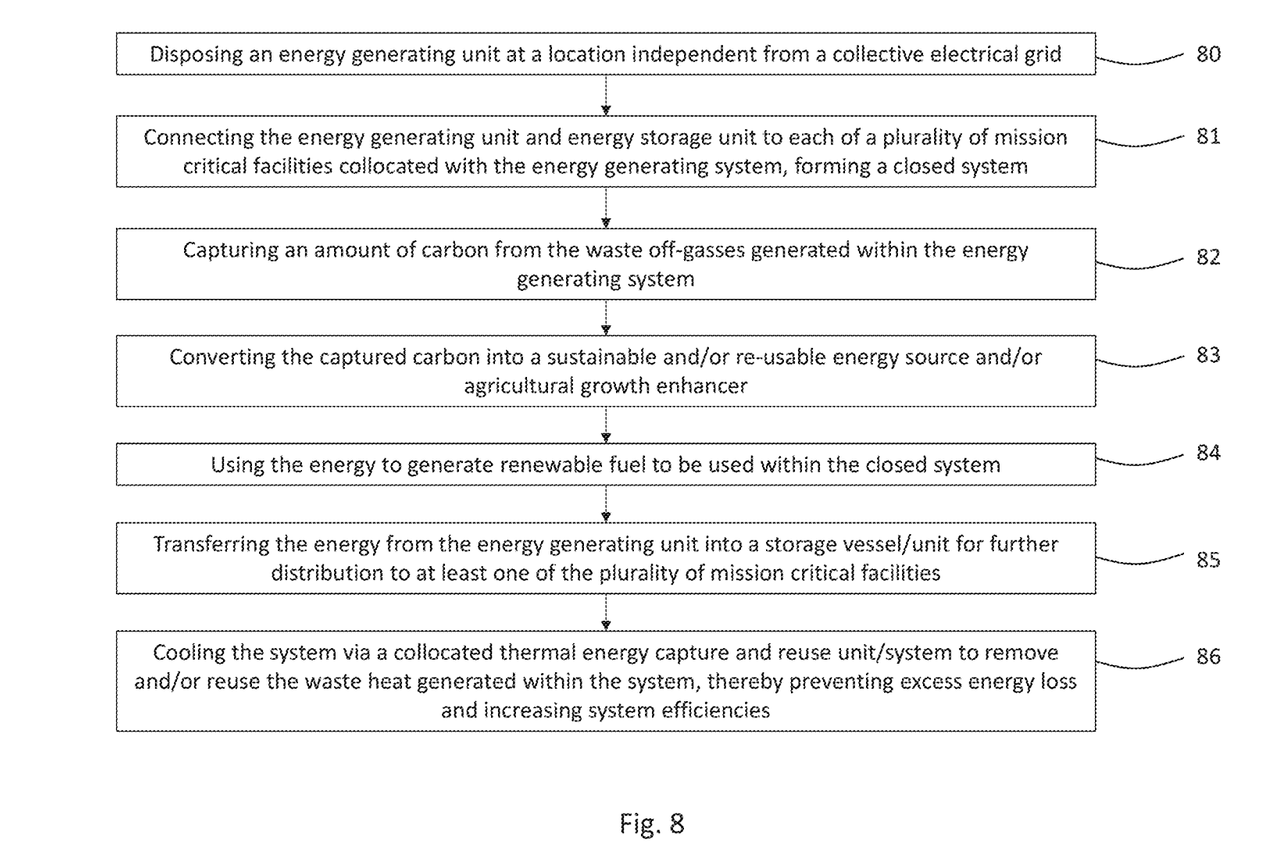
FIG. 8 is a process flow diagram depicting a method of fueling a collocated mission critical facility and energy system within a closed system, in accordance with an embodiment of the present invention.

Referring now to FIG. 8, in conjunction with FIGS. 2-7, an exemplary process-flow diagram is provided, depicting a grid-independent method of efficiently generating electrical and thermal energy, distributing and reusing that energy, capturing waste $CO_2$, distributing, reusing, and/or redistributing the waste $CO_2$, generating renewable fuel, and reducing the carbon footprint within a highly integrated and advanced technology collocated mission critical facility and energy system through a closed system. The steps delineated in the exemplary process-flow diagram of FIG. 8 are merely exemplary of an order of capturing, using, and reusing energy within a closed system of collocated components. The steps may be carried out in another order, with or without additional steps included therein.

As shown in FIG. 8, the method includes step 80, which includes a step of disposing an energy generating unit or system at a location that is independent from a collective electrical grid, thereby creating an independent, non-grid dependent energy generation unit that does not suffer from the typical system failures of an electrical grid connected, grid-dependent system. During step 81, the energy generation unit is connected to a plurality of mission critical facilities that are collocated with the energy generation unit and an energy storage unit within a limited geographic scope, such as a campus or other shared region. As such, a closed system is formed between the energy generation and storage units and the mission critical facilities that are the end use points of the energy from both the energy generation and the energy storage unit.

During step 82, an amount of carbon is captured by the system from the energy generation process. The carbon may be captured directly from the energy generation unit by an integrated capture unit, or may be captured by an independent capture unit that is independent from, but resides in a closed system with, the energy generation unit, and some form of processing and distribution system, as described in greater detail above. Regardless of the location of the energy capture, during step 83, the captured carbon is converted into a usable energy source, as fuel for either additional energy generation (during step 84) or for end use within the closed system independent from the traditional electrical grid.

Next, during step 85, the usable energy stored within the energy storage unit is transferred via one or more electrical distribution systems to one or more mission critical facilities that form the closed system with the energy storage unit. Since the system is a closed system, the energy transferred within the system is not lost to the exterior environment during transfer from the energy storage unit to the mission critical facilities. After being transferred, one or more of the mission critical facilities uses the received energy to maintain an online status, thereby ensuring a continuing infrastructure related to the mission critical facility. For example, if the mission critical facility is a cloud data server facility, the energy received from the energy storage unit ensures that the cloud data server facility remains online without any downtime, such that end users of the cloud data server facility worldwide do not experience any data outages throughout the use of the mission critical facility. Finally, during step 86, a cooling unit within the system removes excess waste heat from the system by flowing water therethrough. In a typical system, waste energy is emitted and lost from the system through heat; however, during step 86, excess heat is removed from the system without being lost to heat, thereby reducing the amount of wasted energy and increasing the efficiencies of the system by reducing overall energy requirements.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A grid-independent, collocated, and closed energy generation, storage, and usage system comprising:
one or more energy generation units each secured to a current transformer via a first electrical micro-grid system;
an energy storage unit in electrical communication with the current transformer via a second electrical micro-grid system, such that the energy storage unit is configured to receive and store energy from the one or more energy generation units;
a plurality of end-use facilities electrically coupled to the energy storage unit via a third electrical micro-grid system, such that each of the plurality of end-use facilities is configured to receive and use energy from the energy storage unit; and
a carbon capture, storage, and distribution system integrated into each of the one or more energy generation units, such that the carbon capture, storage, and distribution system captures an amount of carbon dioxide produced by the one or more energy generation units for reuse within the system,
wherein the closed energy generation, storage, and usage system is configured to be independent from a communal electrical grid, and
wherein the closed energy generation, storage, and usage system is configured to recycle waste energy within the system throughout the electrical micro-grid systems to be reused.

2. The system of claim 1, wherein each of the plurality of end-use facilities is configured to use the energy to maintain a constant online status.

3. The system of claim 1, wherein each of the plurality of end-use facilities is a mission critical facility selected from the group consisting of a data center, an agriculture facility, an aquaculture facility, an industrial facility, a manufacturing facility, and a commercial facility.

4. The system of claim 1, wherein the one or more energy generation units, the energy storage unit, and the plurality of end-use facilities are collocated on a campus having a one-mile radius.

5. The system of claim 1, wherein the one or more energy generation units is configured to capture an amount of energy ranging from 25 megawatts to 250 megawatts.

6. The system of claim 5, wherein the one or more energy generation units includes four independent energy generation units, each of the four independent energy generation units configured to generate an amount of energy ranging from 25 megawatts to 250 megawatts, such that the energy storage unit is configured to store an amount of energy ranging from 100 megawatts to 1 gigawatt.

7. The system of claim 1, further comprising a photoelectrochemical processing and renewable energy generation system in electrical communication with the carbon capture, storage, and distribution system, the photoelectrochemical processing and renewable energy generation system configured to expose the captured amount of carbon dioxide to photon-based electrical energy to convert the amount of carbon dioxide into a secondary fuel source selected from the group consisting of a renewable liquid fuel source and a renewable gaseous fuel source.

8. The system of claim 1, further comprising a cooling component disposed within at least one of the one or more energy generation units and the plurality of end-use facilities, the cooling component including a water reservoir including an amount of water therein, wherein the cooling component is configured to remove heat produced within the system by flowing the amount of the water throughout the system via one or more of the first, second, and third electrical micro-grid systems.

9. The system of claim 8, wherein the amount of water within the water reservoir of the cooling component includes freshwater.

10. The system of claim 9, wherein the water reservoir is in fluidic communication with an underground water supply including freshwater, such that the water reservoir is configured to receive an amount of the underground water supply to refill the cooling component.

11. The system of claim 8, wherein the amount of water within the water reservoir of the cooling component includes saltwater.

12. The system of claim 11, wherein the water reservoir is in fluidic communication with a body of water including saltwater, such that the water reservoir is configured to receive an amount of the body of water to refill the cooling component.

13. A method of capturing, routing, and using energy in a collocated mission critical facility and energy system, the method comprising the steps of:
disposing an energy storage unit at a location that is independent from a collective electrical grid;
connecting the energy storage unit to each of a plurality of mission critical facilities that are collocated with the energy storage unit within a limited geographic scope;
disposing at least one energy generation unit within the limited geographic scope, such that the at least one energy generation unit is collocated with each of the energy storage unit and the plurality of mission critical facilities;
forming a closed system between the at least one energy generation unit, the energy storage unit, and the plurality of mission critical facilities;
generating, via the at least one energy generation unit, an amount of energy usable within the closed system;
capturing, via a carbon capture, storage, and distribution system integrated into the at least one energy generation unit, an amount of carbon dioxide produced by the at least one energy generation unit;
transferring the captured carbon dioxide to a photoelectrochemical processing and renewable energy generation system in electrical communication with the carbon capture, storage, and distribution system; and
exposing the captured amount of carbon dioxide to photon-based electrical energy to convert the amount of carbon dioxide into a secondary fuel source selected from the group consisting of a renewable liquid fuel source and a renewable gaseous fuel source.

14. The method of claim 13, wherein the at least one energy generation unit is one of a plurality of energy generation units, further comprising the step of generating between 25 megawatts and 250 megawatts of energy within each of the plurality of energy generation units for storage within the energy storage unit.

15. The method of claim 13, wherein each of the plurality of mission critical facilities is selected from the group consisting of a data center, an agriculture facility, an aquaculture facility, an industrial facility, a manufacturing facility, and a commercial facility.

16. The method of claim 13, further comprising the step of removing an amount of excess heat from the system by flowing an amount of water through the system, the amount of water stored within a water reservoir disposed within a cooling component disposed within at least one of the one or more energy generation units and the plurality of mission critical facilities.

17. The method of claim 16, further comprising the steps of capturing an amount of replacement water from a water source and storing, within the water reservoir, the captured amount of replacement water for excess heat removal from the system.

* * * * *